(12) United States Patent
Oniki et al.

(10) Patent No.: US 12,095,053 B2
(45) Date of Patent: *Sep. 17, 2024

(54) SECONDARY BATTERY SYSTEM AND METHOD FOR CONTROLLING SECONDARY BATTERY

(71) Applicant: TOYOTA JIDOSHA KABUSHIKI KAISHA, Toyota (JP)

(72) Inventors: Motoyuki Oniki, Toyota (JP); Takashi Ogura, Toyota (JP); Risa Atarashi, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/524,371

(22) Filed: Nov. 11, 2021

(65) Prior Publication Data
US 2022/0069370 A1 Mar. 3, 2022

Related U.S. Application Data

(62) Division of application No. 16/228,984, filed on Dec. 21, 2018, now Pat. No. 11,196,103.

(30) Foreign Application Priority Data

Dec. 25, 2017 (JP) ................................ 2017-248168

(51) Int. Cl.
*H01M 10/48* (2006.01)
*B60L 3/00* (2019.01)
(Continued)

(52) U.S. Cl.
CPC ........... *H01M 10/48* (2013.01); *B60L 3/0046* (2013.01); *G01R 19/16542* (2013.01);
(Continued)

(58) Field of Classification Search
CPC .. H01M 10/48; H01M 10/0525; G01R 31/36; G01R 31/392; G01R 31/389; G01R 19/16542
See application file for complete search history.

(56) References Cited

U.S. PATENT DOCUMENTS 8,981,729 B2* 3/2015 Machida ................. B60L 53/00
320/108
11,196,103 B2* 12/2021 Oniki .................... G01R 31/382
(Continued)

FOREIGN PATENT DOCUMENTS

JP 2012-244888 A 12/2012
JP 2014032826 A * 2/2014
JP 2016004725 A * 1/2016

*Primary Examiner* — Helen Oi K Conley
*Assistant Examiner* — Amanda Rosenbaum
(74) *Attorney, Agent, or Firm* — Sughrue Mion, PLLC

(57) ABSTRACT

An ECU calculates a surface potential of a negative electrode active material relative to a lithium reference potential, according to a battery model for calculating lithium concentration distribution inside the negative electrode active material. The ECU calculates a voltage drop amount associated with charging of a battery, using a charging current to the battery and a reaction resistance, and calculates a negative electrode potential by subtracting the voltage drop amount from the surface potential. The ECU corrects the negative electrode potential, using an SOC of the battery, an average current in a charging period of the battery, and an integrated current in the charging period.

1 Claim, 12 Drawing Sheets

(51) Int. Cl.
  *G01R 19/165* (2006.01)
  *G01R 31/36* (2020.01)
  *G01R 31/382* (2019.01)
  *G01R 31/389* (2019.01)
  *G01R 31/392* (2019.01)
  *H01M 10/0525* (2010.01)

(52) U.S. Cl.
  CPC .......... *G01R 31/36* (2013.01); *G01R 31/382* (2019.01); *G01R 31/392* (2019.01); *H01M 10/0525* (2013.01); *G01R 31/389* (2019.01)

(56) References Cited

U.S. PATENT DOCUMENTS

| | | | |
|---|---|---|---|
| 2012/0299552 A1* | 11/2012 | Machida | H02J 7/04 320/138 |
| 2016/0052419 A1* | 2/2016 | Takahashi | H01M 10/425 429/61 |
| 2019/0198941 A1 | 6/2019 | Oniki et al. | |

* cited by examiner

FIG.4       < ONE-DIMENSIONAL MODEL >

Related Art

US 12,095,053 B2

SECONDARY BATTERY SYSTEM AND METHOD FOR CONTROLLING SECONDARY BATTERY

CROSS-REFERENCE TO RELATED APPLICATIONS

This application is a divisional of U.S. application Ser. No. 16/228,984, filed on Dec. 21, 2018, which is a nonprovisional application based on Japanese Patent Application No. 2017-248168, filed on Dec. 25, 2017 with the Japan Patent Office, the entire contents of which are hereby incorporated by reference.

BACKGROUND

Field

The present disclosure relates to a secondary battery system and a method for controlling a secondary battery, and more particularly to a technique for estimating the state of deposition of lithium on a negative electrode of a lithium ion secondary battery.

Description of the Background Art

In recent years, development of electrically powered vehicles such as hybrid vehicles and electric vehicles has been promoted. Many of secondary battery systems mounted in these electrically powered vehicles adopt a lithium ion secondary battery. This is because, when compared with other secondary batteries, a lithium ion secondary battery generally has a higher energy density and thus can be downsized, and has a higher average operation voltage and thus is suitable for generating a high voltage.

It is known that, in a lithium ion secondary battery, depending on its charged manner, metal lithium (Li) may be deposited on a surface of a negative electrode. This phenomenon will be hereafter also referred to as "lithium deposition". Lithium deposition occurs, for example, when a negative electrode potential falls below a reference potential (potential of metal lithium) in a case where charging of the lithium ion secondary battery at a high rate (high charging speed), charging thereof in a high SOC (State Of Charge) state, continuous charging thereof for a long time, and the like are performed. Occurrence of lithium deposition may cause deterioration in the performance of the lithium ion secondary battery.

Accordingly, there has been proposed a technique of estimating lithium concentration distribution inside an active material (in particular, a negative electrode active material), and calculating a negative electrode potential based on the estimated result, in order to suppress lithium deposition. For example, with a technique disclosed in Japanese Patent Laying-Open No. 2014-032826, lithium concentration distribution is estimated in consideration of a lithium diffusion phenomenon inside an active material by applying a primitive equation (such as a diffusion equation or an equation representing the principle of conservation of charge) to an active material model (see, for example, FIGS. 9 and 10 of Japanese Patent Laying-Open No. 2014-032826).

SUMMARY

It is also conceivable to calculate a negative electrode potential by considering a surface potential of a negative electrode active material and a voltage drop amount due to a reaction resistance when lithium ions are inserted from a surface of the negative electrode active material into the negative electrode active material (details will be described later). However, as a result of studies by the present inventors, it has been found that, when only the two voltage components described above are taken into consideration, the accuracy of calculating the negative electrode potential may be reduced depending on the charging history of a lithium ion secondary battery. In such a case, the state of deposition of lithium on a negative electrode of the lithium ion secondary battery may not be estimated accurately.

The present disclosure has been made to solve the aforementioned problem, and an object thereof is to accurately estimate the state of deposition of lithium on a negative electrode of a lithium ion secondary battery.

(1) A secondary battery system in accordance with an aspect of the present disclosure includes a secondary battery having a negative electrode including a negative electrode active material into and from which lithium ions are inserted and desorbed, and a controller configured to calculate a negative electrode potential indicating a potential of the negative electrode relative to a reference potential. The controller is configured to calculate a surface potential of the negative electrode active material relative to the reference potential, using an amount of lithium ions inserted into the negative electrode active material obtained from a charging current to the secondary battery, and a diffusion coefficient of lithium ions inside the negative electrode active material, according to a battery model for calculating lithium concentration distribution inside the negative electrode active material. The controller is configured to calculate a voltage drop amount associated with charging of the secondary battery, using the charging current to the secondary battery and a reaction resistance of the secondary battery, and calculate the negative electrode potential by subtracting the voltage drop amount from the surface potential. The controller is configured to correct the negative electrode potential, using an SOC of the secondary battery, an average current in a charging period of the secondary battery, and an integrated current in the charging period.

(2) Preferably, the controller is configured to calculate a deposition overvoltage which promotes deposition of lithium on the negative electrode, from the SOC of the secondary battery, the average current, and the integrated current, and correct the negative electrode potential by further subtracting the deposition overvoltage from the surface potential from which the voltage drop amount has been subtracted. The deposition overvoltage is a voltage applied from outside of the negative electrode active material to a surface of the negative electrode active material due to uneven lithium concentration distribution outside the negative electrode active material.

(3) Preferably, the controller is configured to calculate the deposition overvoltage such that the deposition overvoltage increases (becomes higher) as the average current increases, and increases (becomes higher) as the integrated current increases.

With the configurations described above in (1) to (3), the negative electrode potential is corrected based on the average current and the integrated current during the charging period of the secondary battery. By this correction, the deposition overvoltage (the voltage applied to the surface of the negative electrode active material due to uneven lithium concentration distribution outside the negative electrode active material, more specifically, uneven lithium concentration distribution in a thickness direction of an electrode assembly) can be reflected in the negative electrode potential. Therefore, the accuracy of calculating the negative electrode potential is improved, and thus the state of deposition of lithium on the negative electrode can be estimated accurately.

(4) Preferably, the controller is configured to calculate a reaction overvoltage using an equilibrium potential of deposition of lithium on the negative electrode and dissolution of lithium from the negative electrode. When the reaction overvoltage exceeds a predetermined value, the controller is configured to calculate a dissolution overvoltage which promotes dissolution of lithium from the negative electrode, from the SOC of the secondary battery, the average current, and the integrated current, and correct the negative electrode potential by adding the dissolution overvoltage to the surface potential from which the voltage drop amount has been subtracted.

With the configuration described above in (4), the negative electrode potential is corrected in consideration of lithium dissolution from the negative electrode in addition to lithium deposition on the negative electrode. By considering both lithium deposition and lithium dissolution in this manner, the accuracy of calculating the negative electrode potential can be further improved. Hence, the state of deposition of lithium on the negative electrode can be estimated more accurately.

(5) A method for controlling a secondary battery in accordance with another aspect of the present disclosure is to calculate a negative electrode potential of the secondary battery having a negative electrode including a negative electrode active material into and from which lithium ions are inserted and desorbed. The method for controlling the secondary battery includes first to fifth steps. The first step is the step of calculating a surface potential of the negative electrode active material, using an amount of lithium ions inserted into the negative electrode active material obtained from a charging current to the secondary battery, and a diffusion coefficient of lithium ions inside the negative electrode active material, according to a battery model for calculating lithium concentration distribution inside the negative electrode active material. The second step is the step of calculating a voltage drop amount associated with charging of the secondary battery, using the charging current to the secondary battery and a reaction resistance of the secondary battery. The third step is the step of calculating the negative electrode potential by subtracting the voltage drop amount from the surface potential. The fourth step is the step of correcting the negative electrode potential, using an SOC of the secondary battery, an average current in a charging period of the secondary battery, and an integrated current in the charging period. The fifth step is the step of performing protection control for protecting the negative electrode when the negative electrode potential after correction falls below a reference potential.

With the method described above in (5), the state of deposition of lithium on the negative electrode of the secondary battery can be estimated accurately, as with the configuration described above in (1).

The foregoing and other objects, features, aspects and advantages of the present disclosure will become more apparent from the following detailed description of the present disclosure when taken in conjunction with the accompanying drawings.

DESCRIPTION OF THE PREFERRED EMBODIMENTS

Figure 1:
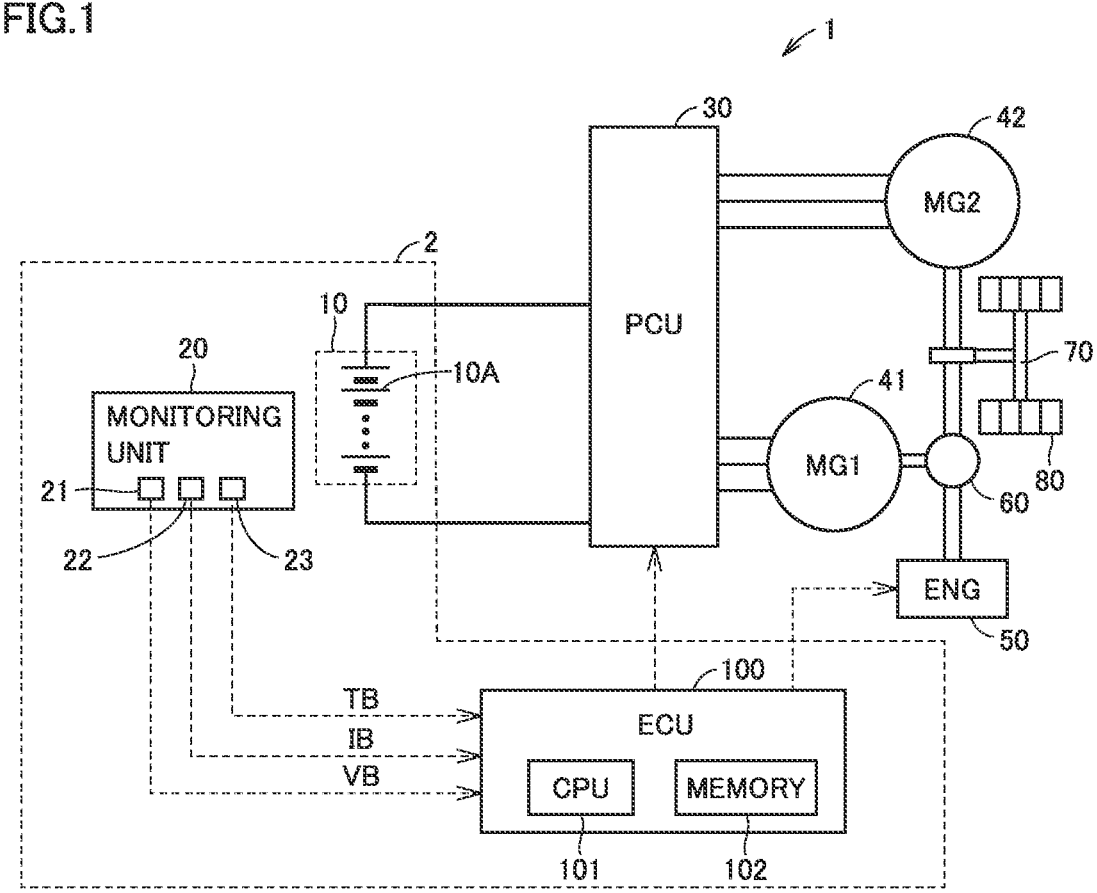
FIG. 1 is a diagram schematically showing an entire configuration of a vehicle equipped with a secondary battery system in accordance with a first embodiment.

Hereinafter, embodiments of the present disclosure will be described in detail with reference to the drawings. It should be noted that identical or corresponding parts will be designated by the same reference numerals in the drawings, and the description thereof will not be repeated.

In the following, a description will be given of an exemplary configuration in which a secondary battery system in accordance with the present disclosure is mounted in an electrically powered vehicle. Although the electrically powered vehicle is typically a hybrid vehicle (including a plug-in hybrid vehicle), the electrically powered vehicle is not limited thereto. The secondary battery system in accordance with the present disclosure is applicable to any vehicle which generates motive power using electric power supplied from a secondary battery system. Accordingly, the electrically powered vehicle may be an electric vehicle or a fuel cell vehicle. In addition, the secondary battery system in accordance with the present disclosure is not limited to be applied to vehicles, and may be applied to stationary machinery, for example.

First Embodiment

<Configuration of Secondary Battery System>

FIG. 1 is a diagram schematically showing an entire configuration of a vehicle equipped with a secondary battery system in accordance with a first embodiment. Referring to FIG. 1, a vehicle 1 is a hybrid vehicle. Vehicle 1 includes a secondary battery system 2, a power control unit (PCU) 30, motor generators 41 and 42, an engine 50, a power split device 60, a drive shaft 70, and a drive wheel 80. Secondary battery system 2 includes a battery 10, a monitoring unit 20, and an electronic control unit (ECU) 100.

Engine 50 is an internal combustion engine which outputs motive power by converting combustion energy generated by combusting an air-fuel mixture containing air and fuel, into kinetic energy of moving elements such as a piston and a rotor.

Power split device 60 includes a planetary gear mechanism (not shown) having three rotation shafts of a sun gear, a carrier, and a ring gear, for example. Power split device 60 splits the motive power output from engine 50 into motive power for driving motor generator 41 and motive power for driving drive wheel 80.

Each of motor generators 41 and 42 is an alternating current (AC) rotating electrical machine, and for example is a three-phase AC synchronous motor with a permanent magnet (not shown) embedded in a rotor. Motor generator 41 is used mainly as a power generator driven by engine 50 via power split device 60. Electric power generated by motor generator 41 is supplied to motor generator 42 or battery 10 via PCU 30.

Motor generator 42 operates mainly as a motor, and drives drive wheel 80. Motor generator 42 is driven by receiving at least one of electric power from battery 10 and the electric power generated by motor generator 41, and a drive force of motor generator 42 is transmitted to drive shaft 70. On the other hand, during braking of the vehicle or while acceleration is reduced at a descending slope, motor generator 42 operates as a power generator and performs regenerative power generation. Electric power generated by motor generator 42 is supplied to battery 10 via PCU 30.

Battery 10 is configured to include a plurality of cells 10A. Battery 10 stores electric power for driving motor generators 41 and 42, and supplies the electric power to motor generators 41 and 42 through PCU 30. In addition, when motor generators 41 and 42 generate electric power, battery 10 receives the generated electric power through PCU 30 and is charged.

Monitoring unit 20 includes a voltage sensor 21, a current sensor 22, and a temperature sensor 23. Voltage sensor 21 detects a voltage VB for each block (module) including a plurality of cells 10A connected in parallel with each other, for example. Current sensor 22 detects a current IB input/output to/from battery 10. Temperature sensor 23 detects a temperature TB for each block. Each sensor outputs a signal indicating its detection result to ECU 100.

It should be noted that the unit of monitoring by voltage sensor 21 and temperature sensor 23 is not limited to a block, and may be a cell 10A, or may be a plurality of adjacent cells 10A (in a number less than the number of cells within the block). Since the internal configuration of battery 10 does not have an influence in particular in the present embodiment, there is no need to distinguish the plurality of cells 10A from each other or distinguish a plurality of blocks from each other. Accordingly, in the following, battery 10 will be considered as the unit of monitoring, and a comprehensive description such as "voltage VB of battery 10 is detected" will be used.

PCU 30 performs bidirectional power conversion between battery 10 and motor generators 41, 42 according to a control signal from ECU 100. PCU 30 is configured to separately control the states of motor generators 41 and 42. For example, PCU 30 can set motor generator 42 to a power running state while setting motor generator 41 to a regenerative state (power generation state). PCU 30 is configured to include, for example, two inverters (not shown) provided corresponding to motor generators 41 and 42, and a converter (not shown) which boosts a direct current (DC) voltage to be supplied to each inverter to be more than or equal to an output voltage of battery 10.

ECU 100 is configured to include a CPU (Central Processing Unit) 101, a memory (ROM (Read Only Memory) and RAM (Random Access Memory)) 102, and input/output ports (not shown) for inputting/outputting various signals.

ECU 100 controls charging and discharging of battery 10 by controlling engine 50 and PCU 30 based on the signal received from each sensor and programs and maps stored in memory 102. Main processing and control performed by ECU 100 include "negative electrode potential calculation processing" for calculating a negative electrode potential V2 of battery 10 and "charging current suppression control" for suppressing a charging current to battery 10, for the purpose of protecting battery 10. The negative electrode potential calculation processing and the charging current suppression control will be described later in detail.

Figure 2:
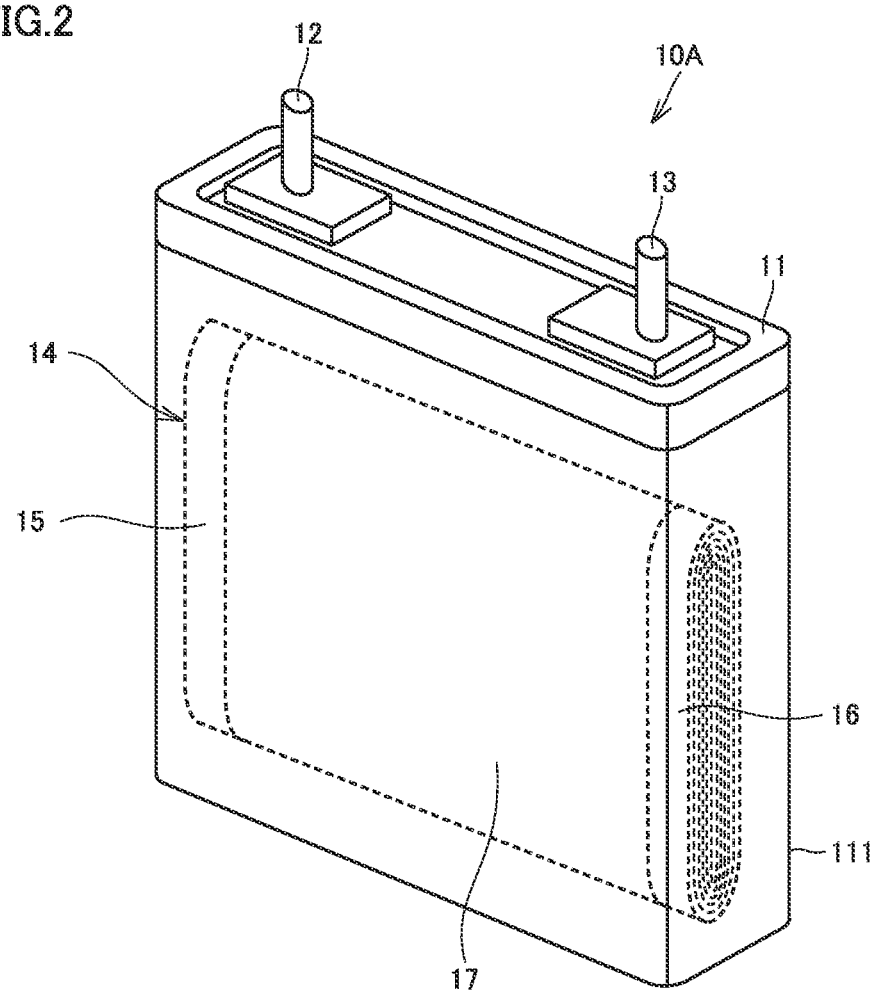
FIG. 2 is a diagram showing an example of a configuration of each cell.

FIG. 2 is a diagram showing an example of a configuration of each cell 10A. Referring to FIG. 2, each cell 10A is a lithium ion secondary battery. An upper surface of a case of cell 10A is sealed with a cover body 11. Cover body 11 is provided with a positive electrode terminal 12 and a negative electrode terminal 13. One ends of positive electrode terminal 12 and negative electrode terminal 13 protrude outward from cover body 11. The other ends of positive electrode terminal 12 and negative electrode terminal 13 are electrically connected to an internal positive electrode terminal and an internal negative electrode terminal (both not shown), respectively, inside a case 111.

An electrode assembly 14 is accommodated inside case 111 (in FIG. 2, electrode assembly 14 is seen through case 111 and is indicated by broken lines). Electrode assembly 14 is formed, for example, by winding a positive electrode (positive electrode sheet) 15 and a negative electrode (negative electrode sheet) 16 stacked with a separator 17 interposed therebetween, into a tubular shape. Positive electrode 15 includes a current collecting foil 151 (see FIG. 4), and a positive electrode active material layer (a layer including a positive electrode active material, a conductive material, and a binder) formed on a surface of current collecting foil 151. Similarly, negative electrode 16 includes a current collecting foil 161, and a negative electrode active material layer (a layer including a negative electrode active material, a conductive material, and a binder) formed on a surface of current collecting foil 161. Separator 17 is provided to contact both the positive electrode active material layer and the negative electrode active material layer. Electrode assembly 14 (the positive electrode active material layer, the negative electrode active material layer, and separator 17) is impregnated with an electrolytic solution.

As materials for positive electrode 15, negative electrode 16, separator 17, and the electrolytic solution, a variety of conventionally known materials can be used. As an example, lithium cobalt oxide or lithium manganese oxide is used for positive electrode 15. Aluminum is used for current collecting foil 151 of positive electrode 15. Carbon (graphite) is used for negative electrode 16. Copper is used for current collecting foil 161 of negative electrode 16. Polyolefin is used for separator 17. The electrolytic solution includes an organic solvent, lithium ions, and an additive.

It should be noted that electrode assembly 14 does not have to be formed as a wound body, and electrode assembly 14 may be a stacked body which is not wound. In addition, although the present embodiment describes an example where cell 10A is an ordinary lithium ion secondary battery (a so-called liquid-based battery), the "lithium ion secondary battery" in the present disclosure may include a lithium polymer battery which uses a polymer gel as an electrolyte.

<Deposition of Metal Lithium on Surface of Negative Electrode>

In secondary battery system 2 configured as described above, voltage VB increases as battery 10 is charged. On this occasion, changes in a positive electrode potential V1 and negative electrode potential V2 occur.

Figure 3:
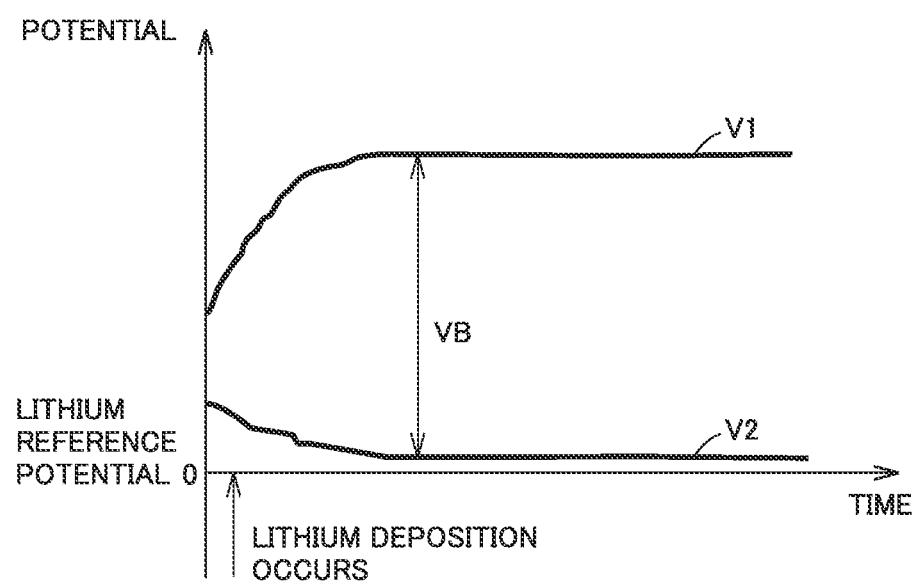
FIG. 3 is a diagram showing an example of temporal changes in a positive electrode potential and a negative electrode potential during charging of a battery.

FIG. 3 is a diagram showing an example of temporal changes in positive electrode potential V1 and negative electrode potential V2 during charging of battery 10. In FIG. 3, the axis of abscissas represents an elapsed time from the start of charging of battery 10, and the axis of ordinates represents a potential relative to a potential of metal lithium which is a reactive material within negative electrode 16 (lithium reference potential).

Referring to FIG. 3, positive electrode potential V1 is the potential of positive electrode 15 relative to the lithium reference potential. Negative electrode potential V2 is the potential of negative electrode 16 relative to the lithium reference potential. Voltage VB of battery 10 is a potential difference (V1−V2) between positive electrode potential V1 and negative electrode potential V2. By continuously charging battery 10, positive electrode potential V1 increases, whereas negative electrode potential V2 decreases, and thereby voltage VB increases.

Generally, when the potential of a negative electrode active material falls below the potential of a reactive material, deposition of the reactive material occurs. That is, in battery 10, when negative electrode potential V2 becomes less than or equal to the lithium reference potential (=0 V), metal lithium is deposited on a surface of the negative electrode. Therefore, during charging of battery 10, decrease of negative electrode potential V2 is prevented by suppressing a charging current, for example, to maintain negative electrode potential V2 to be higher than the lithium reference potential (the charging current suppression control described later). This prevents lithium deposition on the surface of the negative electrode.

Conversely, when the potential of the negative electrode active material exceeds the potential of a reactive material, dissolution of the reactive material occurs. That is, when negative electrode potential V2 is higher than the lithium reference potential, metal lithium deposited on the surface of the negative electrode is dissolved in the electrolytic solution. Such dissolution of metal lithium will be described in a second embodiment.

<One-Dimensional Battery Model>

In order to calculate negative electrode potential V2, it is required to establish a battery model which simplifies battery 10. For easier understanding of the battery model adopted in the present embodiment, a battery model in a comparative example will be briefly described first in the following. It should be noted that lithium ions and metal lithium are also comprehensively described as "lithium".

Figure 4:
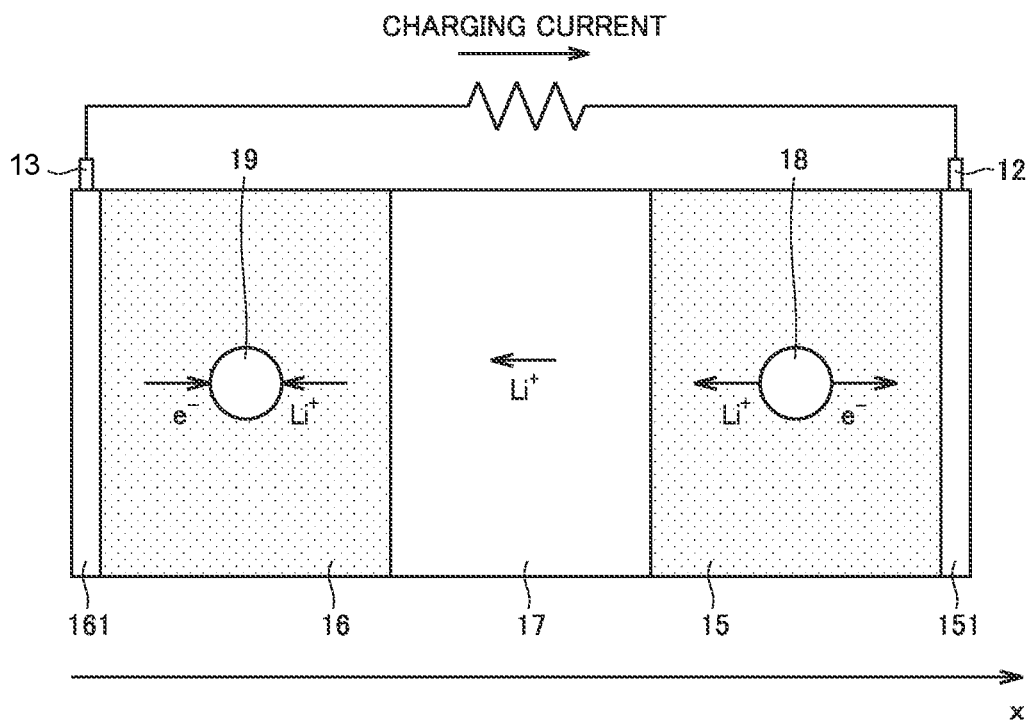
FIG. 4 is a conceptual diagram of a battery model in a comparative example.

FIG. 4 is a conceptual diagram of a battery model in a comparative example. Referring to FIG. 4, in the battery model in the comparative example, positive electrode 15 is composed of an aggregate of a number of positive electrode active materials 18. Similarly, negative electrode 16 is composed of an aggregate of a number of negative electrode active materials 19. However, FIG. 4 shows one positive electrode active material 18 and one negative electrode active material 19 due to space limitation.

A coordinate x extending in a lateral direction in FIG. 4 indicates a position in a thickness direction of electrode assembly 14, that is, a direction in which positive electrode 15 and negative electrode 16 are stacked with separator 17 interposed therebetween. In this manner, the comparative example adopts a one-dimensional model which includes position x in the thickness direction of electrode assembly 14 as a parameter but does not consider a position in an in-plane direction of electrode assembly 14 in particular.

Negative electrode potential V2 can be calculated by simultaneously solving various primitive equations in the one-dimensional model. It should be noted that, since these primitive equations are described for example in Japanese Patent Laying-Open No. 2014-032826 as equations (1) to (14), the detailed description thereof will not be repeated.

<Zero-Dimensional Battery Model>

ECU 100 serving as a vehicle-mounted ECU has a limited computing resource (computing capacity), when compared with a typical computer for research and development (for example, a computer for simulation). Therefore, the present embodiment adopts a more simplified zero-dimensional battery model in order to reduce a computing load of ECU 100 and shorten a computing time of ECU 100.

Figure 5:
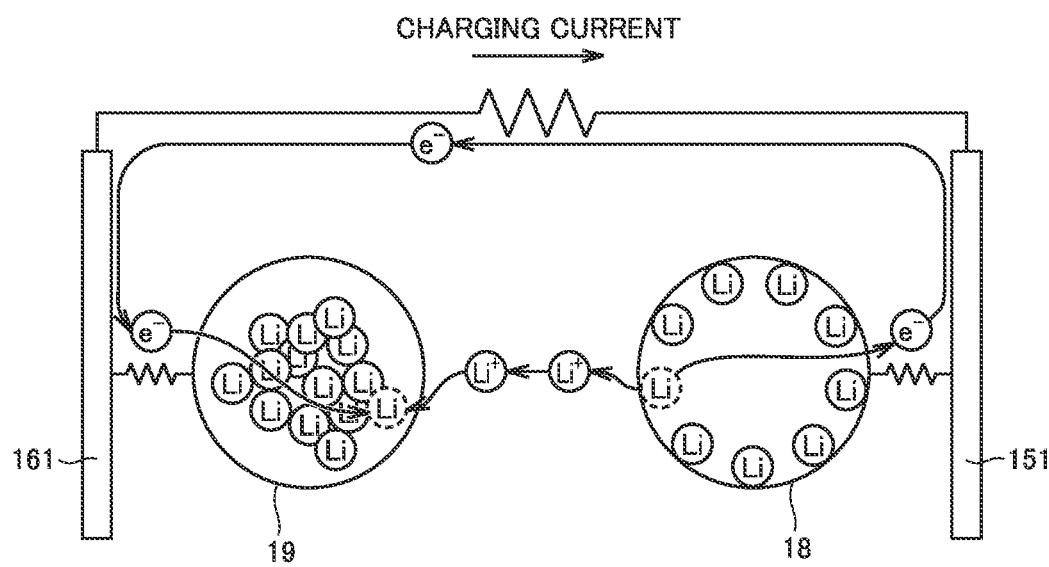
FIG. 5 is a conceptual diagram of a battery model in the present embodiment.

FIG. 5 is a conceptual diagram of a battery model in the present embodiment. Referring to FIG. 5, the present embodiment adopts a zero-dimensional battery model which assumes that only one particle of positive electrode active material 18 and only one particle of negative electrode active material 19 exist, as shown in FIG. 5. More specifically, although positive electrode 15 includes a number of positive electrode active materials 18, a number of positive electrode active materials 18 are represented by single positive electrode active material 18, based on an assumption that an electrochemical reaction in each positive electrode active material 18 is uniform. Similarly, a number of negative electrode active materials 19 included in negative electrode 16 are represented by single negative electrode active material 19.

After adopting the battery model simplified as described above, negative electrode potential V2 is calculated. A negative electrode active material model will now be described in more detail.

Figure 6:
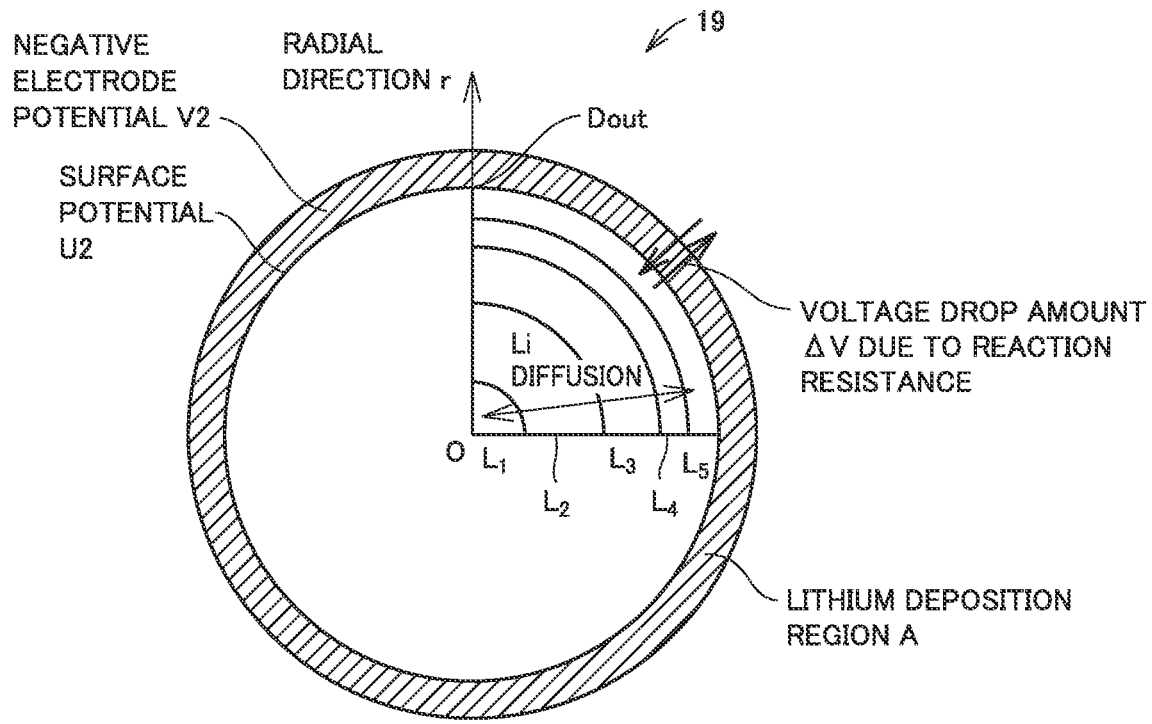
FIG. 6 is a diagram for illustrating a negative electrode active material model in the present embodiment.

FIG. 6 is a diagram for illustrating a negative electrode active material model in the present embodiment. Referring to FIG. 6, negative electrode active material 19 is virtually divided into N layers in a radial direction r. In the following, an example where N=5 will be described. However, N is not particularly limited as long as N is two or more. The divided five layers will be described as $L_1$ to $L_5$ from a center O toward an outer circumference of negative electrode active material 19. The distance in radial direction r of negative electrode active material 19 is 0 at center O of negative electrode active material 19, and Dout at an outer surface (outermost surface) of negative electrode active material 19. It should be noted that thicknesses of layers $L_n$ (n=1 to 5) may be different from each other as shown in FIG. 6, or may be equal.

In the present embodiment, negative electrode potential V2 in a region A (a diagonally shaded region) in the outer surface of negative electrode active material 19 in which lithium deposition occurs is calculated. To calculate negative electrode potential V2 in lithium deposition region A, it is conceivable to consider two voltage components described below.

A first voltage component is a "surface potential U2" which indicates a potential determined according to lithium concentrations within layers $L_1$ to $L_5$ (lithium concentration distribution). Although details will be described later, surface potential U2 is calculated in consideration of diffusion of lithium inside negative electrode active material 19. A second voltage component is a "voltage drop amount ΔV due to a reaction resistance" when lithium is input/output to/from the outer surface of negative electrode active material 19 (lithium is input during charging). It should be noted that the reaction resistance means an impedance component associated with transmission and reception of charge (charge transfer) at an interface between the electrolytic solution and the outer surface of negative electrode active material 19.

As a result of studies by the present inventors, it has been found that, in the negative electrode potential calculation processing which adopts the zero-dimensional battery model as in the present embodiment, when only the two voltage components described above are taken into consideration, the accuracy of calculating negative electrode potential V2 may be reduced depending on the charging history of battery 10. More specifically, when battery 10 is charged with a relatively large current, reduction in the accuracy of calculating negative electrode potential V2 tends to be significant.

This is considered to be because, unlike the one-dimensional battery model (see FIG. 4) as in the comparative example, the zero-dimensional battery model does not consider the lithium concentration distribution in thickness direction x of electrode assembly 14 (that is, the lithium concentration distribution outside positive electrode active material 18 and negative electrode active material 19, such as in the electrolytic solution). Although uneven lithium distribution associated with charging of battery 10 may also occur outside the active materials, when battery 10 is charged with a large current, the speed at which lithium distribution becomes uneven (the speed at which unevenness of the lithium concentration distribution increases) is relatively faster than the speed at which lithium is diffused (the speed at which unevenness is relieved). Accordingly, diffusion of lithium fails to keep up with the speed at which lithium distribution becomes uneven, and as a result, a voltage due to uneven lithium concentration distribution is applied to the outer surface of negative electrode active material 19. Since this voltage component promotes lithium deposition on the surface of the negative electrode (lithium deposition region A), this voltage component is also described as a "deposition overvoltage ηp".

Therefore, in the present embodiment, negative electrode potential V2 is calculated considering deposition overvoltage np according to the charging history of battery 10. More specifically, negative electrode potential V2 calculated from the two voltage components described above is corrected using an average current IBave and an integrated current ΣIB of battery 10 during charging of battery 10. Through this correction, the accuracy of calculating negative electrode potential V2 can be improved while shortening the computing time, which is an advantage of the zero-dimensional model, as described below.

<Flow of Charging Current Suppression Control>

Figure 7:
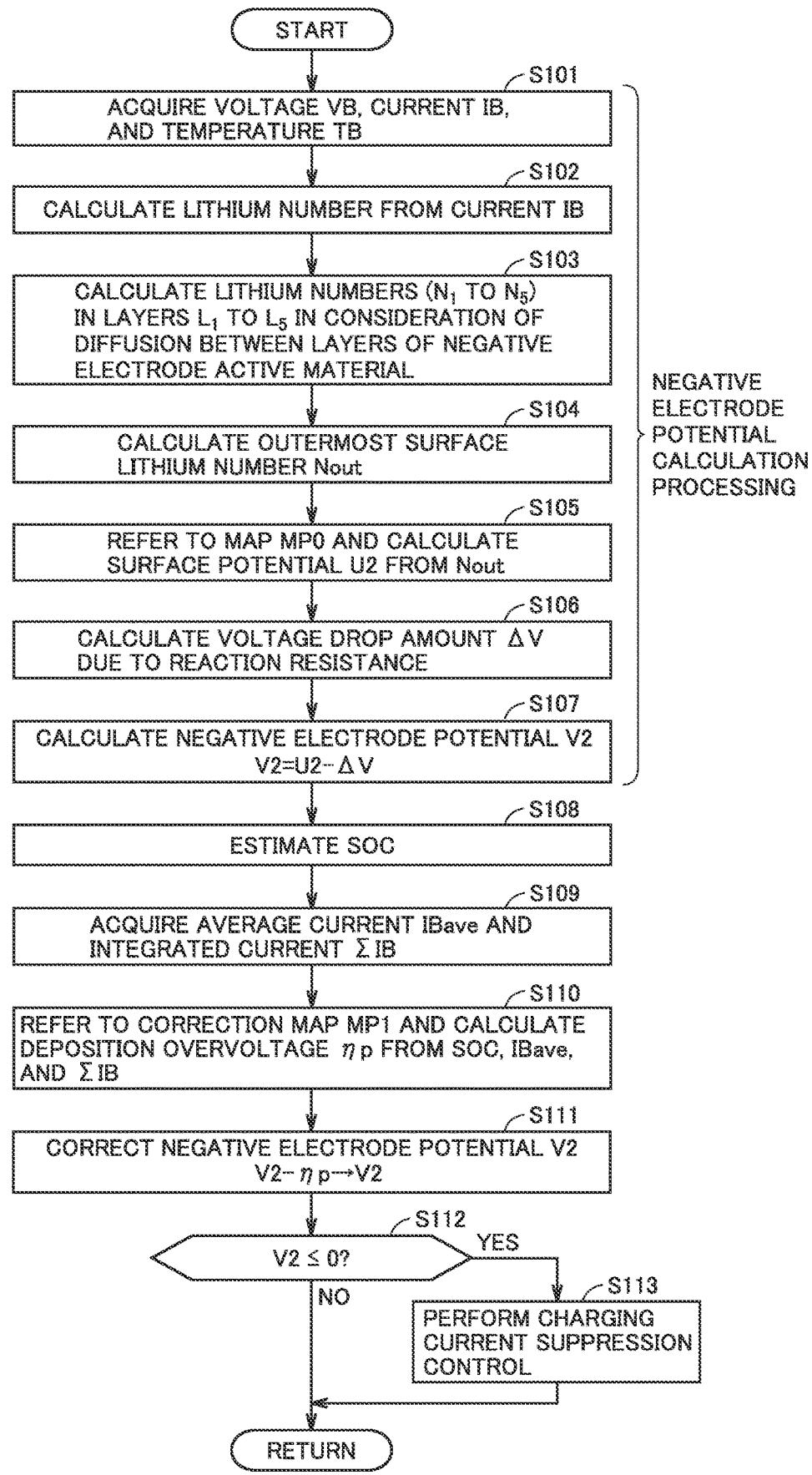
FIG. 7 is a flowchart showing charging current suppression control in the first embodiment.

FIG. 7 is a flowchart showing the charging current suppression control in the first embodiment. The flowcharts shown in FIG. 7 and FIG. 10 described later are performed each time a predetermined computing cycle (for example, approximately 100 milliseconds) elapses during charging of battery 10, for example. Although each step (hereinafter abbreviated as S) in these flowcharts is basically implemented by software processing performed by ECU 100, each step may be implemented by hardware processing performed by electric circuitry fabricated within ECU 100.

In the following, a period starting from the start of charging of battery 10 will be referred to as a "charging period". In a case where charging of battery 10 for which charging/discharging has been stopped is started, the charging period means a period starting from the end of the stop (=the start of charging). Further, in a case where the direction of charging/discharging battery 10 is switched in vehicle 1 travels, for example, the charging period means a period starting from the switching from discharging to charging. It is assumed that ECU 100 calculates average current IBave indicating an average value of current IB during the charging period, and integrated current ΣIB indicating an integrated value of current IB during the charging period, in other flows now shown.

Referring to FIG. 7, in S101, ECU 100 acquires the detection result of each sensor within monitoring unit 20. Specifically, ECU 100 acquires voltage VB of battery 10 detected by voltage sensor 21. ECU 100 acquires current IB input/output to/from battery 10 detected by current sensor 22. ECU 100 acquires temperature TB of battery 10 detected by temperature sensor 23.

In S102, ECU 100 calculates a lithium number input to negative electrode active material 19 (more specifically, outermost layer $L_5$ of negative electrode active material 19), from current IB acquired in S101. Specifically, a current density (unit: $C/(m^2 \cdot s)$) is calculated by dividing current IB (unit: A=C/s) by the area of plates of positive electrode 15 and negative electrode 16 in electrode assembly 14. By multiplying the current density by the computing cycle (unit: s) and an inflow coefficient (unit: $m^2$), a charge amount (unit: C) input/output to/from negative electrode active material 19 is obtained. Since the charge amount of each lithium ion is known, the lithium number input/output to/from negative electrode active material 19 can be obtained by dividing the charge amount input/output to/from negative electrode active material 19 by the charge amount of each lithium ion.

In S103, ECU 100 calculates lithium numbers $N_1$ to $N_5$ included in layers $L_1$ to $L_5$, respectively, in consideration of lithium diffusion between adjacent layers of layers $L_n$ (n=1 to 5). Specifically, a calculation technique as described below can be used. Namely, a lithium number within layer $L_n$ in an m-th computing cycle (m is a natural number) is described as $N_n(m)$. In that case, lithium number $N_n(m)$ within layer $L_n$ is represented by the following equation (1):

$$N_n(m+1) = N_n(m) + N_n^{in}(m) - N_n^{out}(m) \qquad (1)$$

In equation (1), a lithium inflow number from another adjacent layer to layer $L_n$ is described as $N_n^{in}(m)$, and a lithium outflow number from layer $L_n$ to an adjacent layer is described as $N_n^{out}(m)$. Lithium inflow number $N_n^{in}(m)$ to layer $L_n$ is represented by the following equation (2):

$$N_n^{in}(m) = D \times C_{n+1} \times \Delta N_{n+1}(m) + D \times A_n \times \Delta N_n(m) \qquad (2)$$

On the other hand, lithium outflow number $N_n^{out}(m)$ from layer $L_n$ is represented by the following equation (3):

$$N_n^{out}(m) = D \times A_{n+1} \times \Delta N_{n+1}(m) + D \times C_n \times \Delta N_n(m) \qquad (3)$$

In the above equations (2) and (3), D is a diffusion coefficient. C and A are constants for correcting different surface areas (areas of spherical layer surfaces shown in FIG. 6) between adjacent layers. More specifically, constant C is a correction constant in consideration of a difference in surface area in lithium inflow from an outer layer (layer $L_{n+1}$) to an inner layer (layer $L_n$) adjacent to the outer layer. Conversely, constant A is a correction constant in consideration of a difference in surface area in lithium outflow from an inner layer to an outer layer adjacent to the inner layer. $\Delta N_{n+1}$ is a difference in lithium number between layer $L_{n+1}$ and layer $L_n$. $\Delta N_n$ is a difference in lithium number between layer $L_n$ and layer $L_{n-1}$. Lithium number $N_n(m)$ within layer $L_n$ can be calculated by giving an initial value ($N_n(0)$) for all layers $L_n$ (n=1 to 5) and repeatedly solving the above equations (1) to (3).

In S104, ECU 100 calculates a lithium number existing in the outermost surface of negative electrode active material 19, from lithium numbers $N_4$ and $N_5$ calculated in S103. This lithium number will be described as an "outermost surface lithium number Nout". Outermost surface lithium number Nout is calculated as described below.

Figure 8:
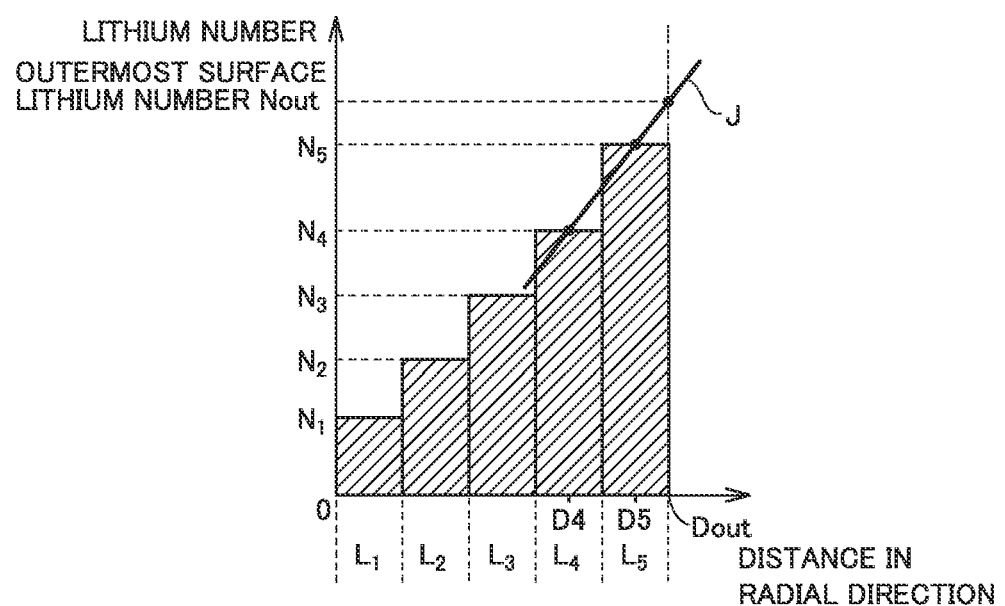
FIG. 8 is a diagram for illustrating a technique of calculating an outermost surface lithium number (process in S104 of FIG. 7) in more detail.

FIG. 8 is a diagram for illustrating a technique of calculating outermost surface lithium number Nout (process in S104 of FIG. 7) in more detail. In FIG. 8, the axis of abscissas represents a distance along radial direction r of negative electrode active material 19. The position of center O of negative electrode active material 19 is indicated by a distance 0, and the distance increases toward the outside of negative electrode active material 19. The axis of ordinates represents the calculated result of the lithium number at each position.

Referring to FIG. 8, lithium numbers $N_1$ to $N_5$ are already calculated by the process in S103. Here, it is assumed that lithium number $N_4$ within layer La indicates a lithium number at an exactly intermediate distance between an innermost distance and an outermost distance of layer $L_4$ (see FIG. 6). It is also assumed that lithium number $N_5$ within layer $L_5$ indicates a lithium number at an exactly intermediate distance between an innermost distance and an outermost distance (=a distance corresponding to the outermost surface of negative electrode active material 19) of layer $L_5$. Thus, a straight line J which connects a point ($D_4$, $N_4$) indicating lithium number $N_4$ within layer $L_4$ and a point ($D_5$, $N_5$) indicating lithium number $N_5$ within layer $L_5$ can be obtained. By extrapolating straight line J to a position at the outermost surface (having distance Dout), a point (Dout, Nout) is obtained.

Turning back to FIG. 7, in S105, ECU 100 calculates surface potential U2 from outermost surface lithium number Nout. Generally, the surface potential of an active material is determined according to the amount of the active material existing in a surface of the active material. Therefore, the correlation between outermost surface lithium number Nout and surface potential U2 is obtained by a preliminary experiment, and is stored as a map MP0 in memory 102 of ECU 100, for example.

Figure 9:
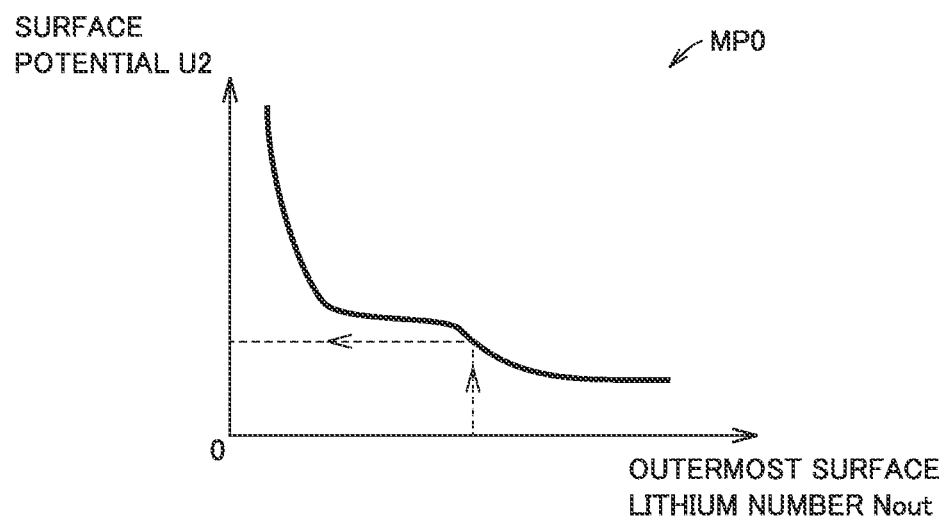
FIG. 9 is a diagram showing an example of a map for calculating a surface potential.

FIG. 9 is a diagram showing an example of map MP0 for calculating surface potential U2. In FIG. 9, the axis of abscissas represents outermost surface lithium number Nout, and the axis of ordinates represents surface potential U2. As shown in FIG. 9, surface potential U2 decreases as outermost surface lithium number Nout increases. By referring to this map MP0, ECU 100 can calculate surface potential U2 from outermost surface lithium number Nout. It should be noted that a function or a conversion equation may be prepared instead of a map.

Referring to FIG. 7 again, in S106, ECU 100 calculates voltage drop amount ΔV due to the reaction resistance (ΔV>0). Voltage drop amount ΔV can be calculated according to the Butler-Volmer equation represented by the following equation (4):

$$V = \frac{RT_B}{\alpha\beta F}\sinh^{-1}\left(\frac{-\beta I}{2La i_0 k/g}\right) \qquad (4)$$

It should be noted that, in equation (4), R indicates the reaction resistance, F indicates the Faraday constant, a indicates a charge transfer coefficient, a indicates a specific surface area of negative electrode active material 19, L indicates a film thickness of negative electrode active material 19, $i_0$ indicates an exchange current density, k indicates a standard speed constant, and g indicates activation energy. I is the product of a current density and a deposition surface area. When negative electrode potential V2 (=U2−ΔV) is 0, the relation U2=ΔV (=IR) is satisfied. Therefore, voltage drop amount ΔV can be calculated by substituting U2 for V into equation (4) and solving equation (4) for IR.

In S107, ECU 100 calculates negative electrode potential V2 by subtracting voltage drop amount ΔV calculated in S106 from surface potential U2 calculated in S105 (V2=U2−ΔV). It should be noted that the processes in S101 to S107 correspond to the negative electrode potential calculation processing.

In S108, ECU 100 estimates the SOC of battery 10 based on the detection result of each sensor within monitoring unit 20 acquired in S101. As a technique for estimating the SOC, a variety of known techniques such as the current integration method can be used.

In S109, ECU 100 acquires average current IBave in the charging period and integrated current ΣIB in the charging period. As described above, average current IBave and integrated current ΣIB are calculated in other flows now shown, based on a detection value (current IB) of current sensor 22.

Memory 102 of ECU 100 stores a correction map MP1 described later. By referring to correction map MP1, ECU 100 calculates deposition overvoltage np for correcting negative electrode potential V2, from the SOC of battery 10 estimated in S108 and average current IBave and integrated current ΣIB acquired in S109 (S110).

Figure 10:
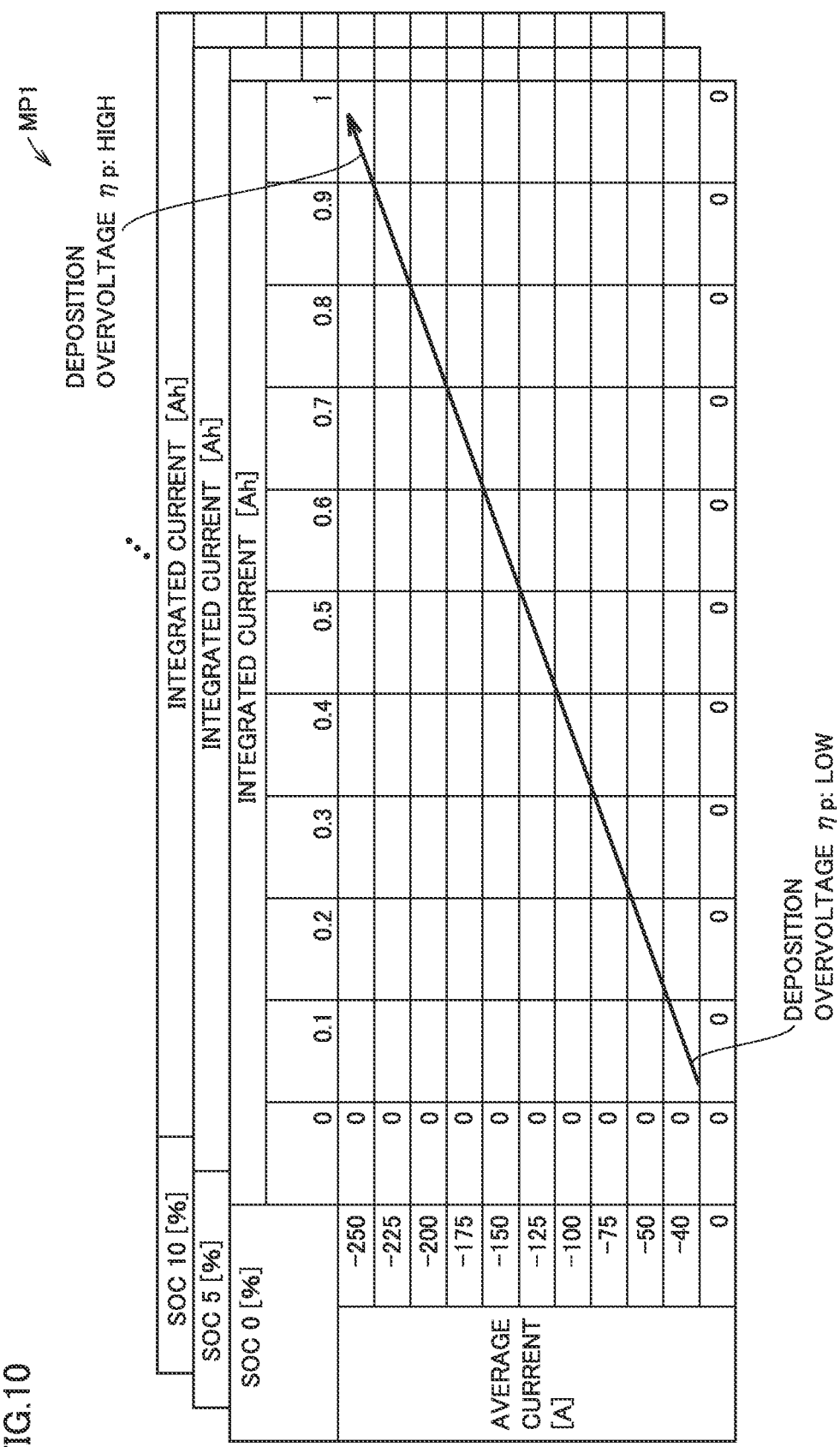
FIG. 10 is a diagram showing an example of a correction map MP1.

FIG. 10 is a diagram showing an example of correction map MP1. Referring to FIG. 10, in correction map MP1, deposition overvoltage np is defined for each combination of the SOC of battery 10, average current IBave, and integrated current ΣIB (SOC, IBave, ΣIB) based on the result of a preliminary experiment. As indicated by an arrow in the drawing, deposition overvoltage np becomes higher from the lower left to the upper right in the drawing. That is, deposition overvoltage np becomes higher as average current IBave increases, and becomes higher as integrated current ΣIB increases. It is described for confirmation that the concrete numerical values shown in FIG. 10 are merely examples for facilitating understanding.

The reason why two parameters, average current IBave and integrated current ΣIB, are used as current-related parameters will be described. For example, comparison is made between a first charging pattern in which current IB is constant at 10 A during a charging period of 10 seconds and a second charging pattern in which current IB is also constant at 10 A during a charging period of 20 seconds. In the first charging pattern and the second charging pattern, average current IBave is equal, whereas integrated current ΣIB is different. In this case, the lithium concentration distribution in thickness direction x of electrode assembly 14 tends to become more uneven in the second charging pattern in which integrated current ΣIB is relatively large, when compared with the first charging pattern. By using integrated current ΣIB as a parameter, such a difference can be reflected in deposition overvoltage np.

In addition, for example, comparison is made between the above first charging pattern in which current IB is constant at 10 A during a charging period of 10 seconds and a third charging pattern in which current IB is constant at 20 A during a charging period of 5 seconds. In the first charging pattern and the third charging pattern, integrated current ΣIB is equal, whereas average current IBave is different. In this case, the lithium concentration distribution in thickness direction x of electrode assembly 14 tends to become more uneven in the third charging pattern in which average current IBave is relatively large, when compared with the first charging pattern. By using average current IBave as a parameter, such a difference can also be reflected in deposition overvoltage ηp.

It should be noted that, although FIG. 10 shows an example of a three-dimensional map including three parameters (SOC, IBave, ΣIB), a four-dimensional map further including temperature TB of battery 10 may be prepared. Thereby, deposition overvoltage ηp can be calculated with higher accuracy.

Referring to FIG. 7 again, in S111, ECU 100 corrects negative electrode potential V2, using deposition overvoltage ηp obtained by referring to correction map MP1. Negative electrode potential V2 after correction is a potential obtained by subtracting deposition overvoltage ηp from negative electrode potential V2 before correction (=U2−ΔV) (V2−ηp→V2).

In S112, ECU 100 determines whether or not lithium deposition on negative electrode 16 may occur, based on negative electrode potential V2 after correction. Specifically, ECU 100 determines whether or not negative electrode potential V2 after correction is less than or equal to the lithium reference potential, that is, whether or not negative electrode potential V2 is less than or equal to 0 V (V2≤0).

When negative electrode potential V2 after correction is less than or equal to 0 V (YES in S112), ECU 100 assumes that lithium deposition on negative electrode 16 may occur and advances the processing to S113, and performs the charging current suppression control. Since this charging current suppression control is equal to the control described in FIG. 5 of Japanese Patent Laying-Open No. 2012-244888, for example, detailed description thereof will not be repeated. However, for example, an input current limit target value Itag is calculated based on a current IB(t) and an acceptable input current Ilim(t) at a time t, by offsetting a predetermined amount relative to Ilim(t). Then, based on obtained Itag, Win(t) indicating a control upper limit value of charging power to battery 10 is calculated. Thereafter, the processing is returned to a main routine not shown.

It should be noted that, when negative electrode potential V2 after correction is higher than 0 V (NO in S112), ECU 100 assumes that lithium deposition on negative electrode 16 may not occur and skips the process in S113, and returns the processing to the main routine.

As described above, according to the first embodiment, negative electrode potential V2 is corrected based on average current IBave and integrated current ΣIB during the charging period of battery 10. By this correction, deposition overvoltage ηp (that is, the voltage applied to the outer surface of negative electrode active material 19 due to uneven lithium concentration distribution in thickness direction x of electrode assembly 14) can be reflected in negative electrode potential V2. Therefore, the accuracy of calculating negative electrode potential V2 is improved, and thus the state of deposition of lithium on negative electrode 16 can be estimated accurately.

Further, the parameters (the SOC, average current IBave, and integrated current ¿IB) in correction map MP1 used to calculate deposition overvoltage ηp can each be calculated by simple computation. Hence, according to the present embodiment, the accuracy of estimating the state of deposition of lithium on negative electrode 16 can be improved while maintaining reduction of the computing load and shortening of the computing time, which are advantages of the zero-dimensional model.

Second Embodiment

The first embodiment describes that negative electrode potential V2 is corrected using deposition overvoltage ηp calculated from correction map MP1. On the other hand, lithium once deposited on lithium deposition region A of negative electrode active material 19 (see FIG. 6) is not necessarily maintained in that state, and may be dissolved in the electrolytic solution and return to lithium ions. The second embodiment will describe a configuration which considers lithium dissolution in addition to lithium deposition.

Figure 11:
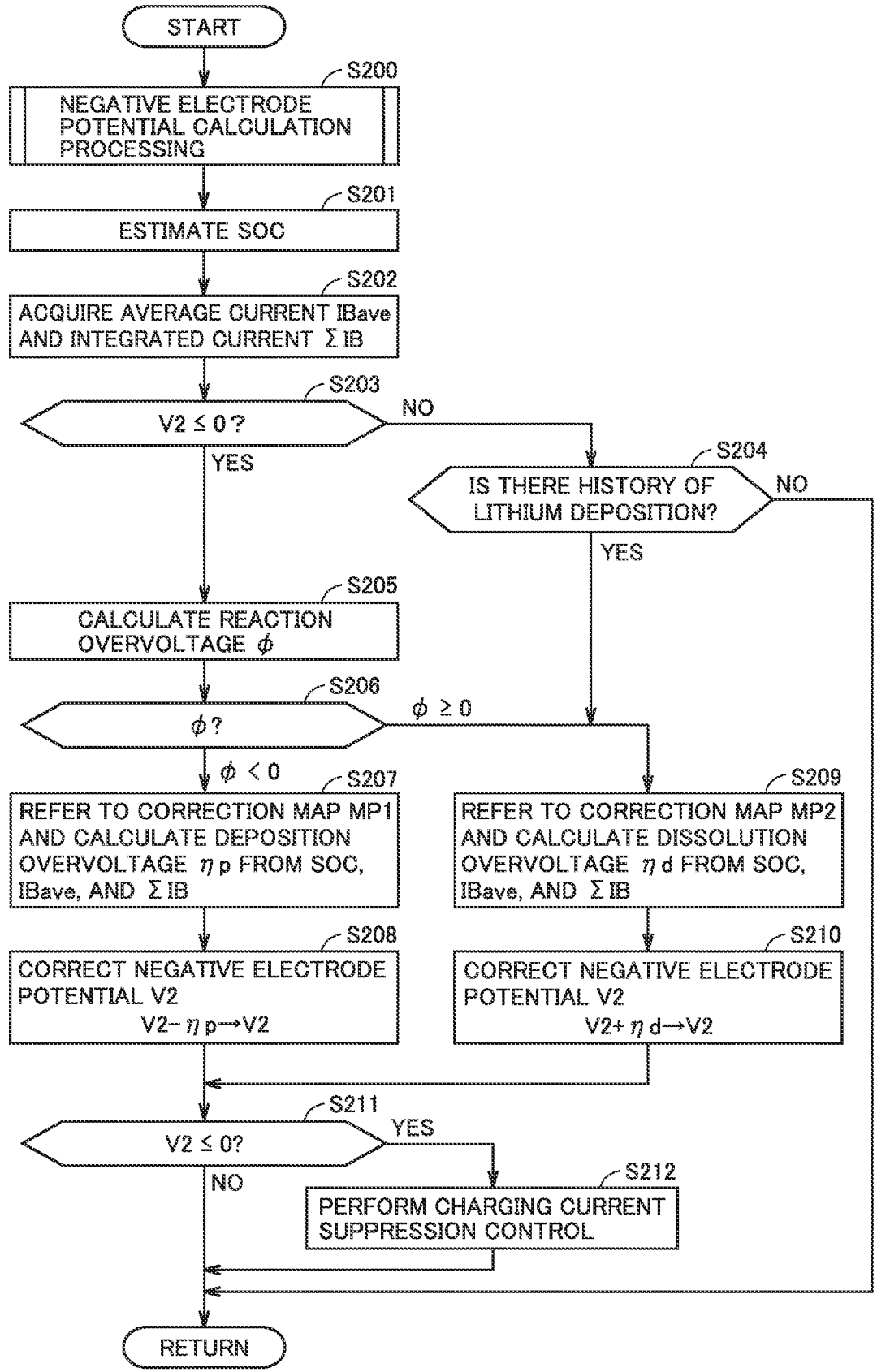
FIG. 11 is a flowchart showing charging current suppression control in a second embodiment.

FIG. 11 is a flowchart showing charging current suppression control in the second embodiment. Referring to FIG. 11, since the negative electrode potential calculation processing in S200 is equal to the negative electrode potential calculation processing in the first embodiment (processes in S101 to S107 of FIG. 7), the description thereof will not be repeated. In addition, since the process in S201 and the process in S202 are also equal to the process in S108 and the process in S109 in the first embodiment, respectively, the description thereof will not be repeated.

In S203, ECU 100 determines whether or not negative electrode potential V2 before correction is less than or equal to 0 V (V2≤0). When negative electrode potential V2 before correction is less than or equal to 0 V (YES in S203), ECU 100 assumes that lithium deposition may occur and advances the processing to S205, and calculates a reaction overvoltage φ of lithium deposition/dissolution reactions. Reaction overvoltage φ can be calculated from surface potential U2, an equilibrium potential Ueq of the deposition reaction and the dissolution reaction, and voltage drop amount ΔV due to the reaction resistance, as represented by the following equation (5). It should be noted that, since equilibrium potential Ueq is a known value, reaction overvoltage ¢ can be calculated from negative electrode potential V2 before correction (=U2−ΔV).

$$\phi = U2 - Ueq - \Delta V \quad (5)$$

In S206, ECU 100 determines whether reaction overvoltage φ is positive or negative. When reaction overvoltage φ is negative (φ<0 in S206), ECU 100 determines that lithium deposition on lithium deposition region A occurs, and advances the processing to S207. The process in S207 and the process in S208 are equal to the process in S110 and the process in S111 in the first embodiment, respectively.

On the other hand, when reaction overvoltage φ is 0 or positive (φ≥0 in S206), ECU 100 determines that lithium dissolution from lithium deposition region A occurs, and advances the processing to S209. Then, ECU 100 calculates a dissolution overvoltage ηd from the SOC of battery 10, average current IBave, and integrated current ΣIB, by referring to a correction map MP2.

Figure 12:
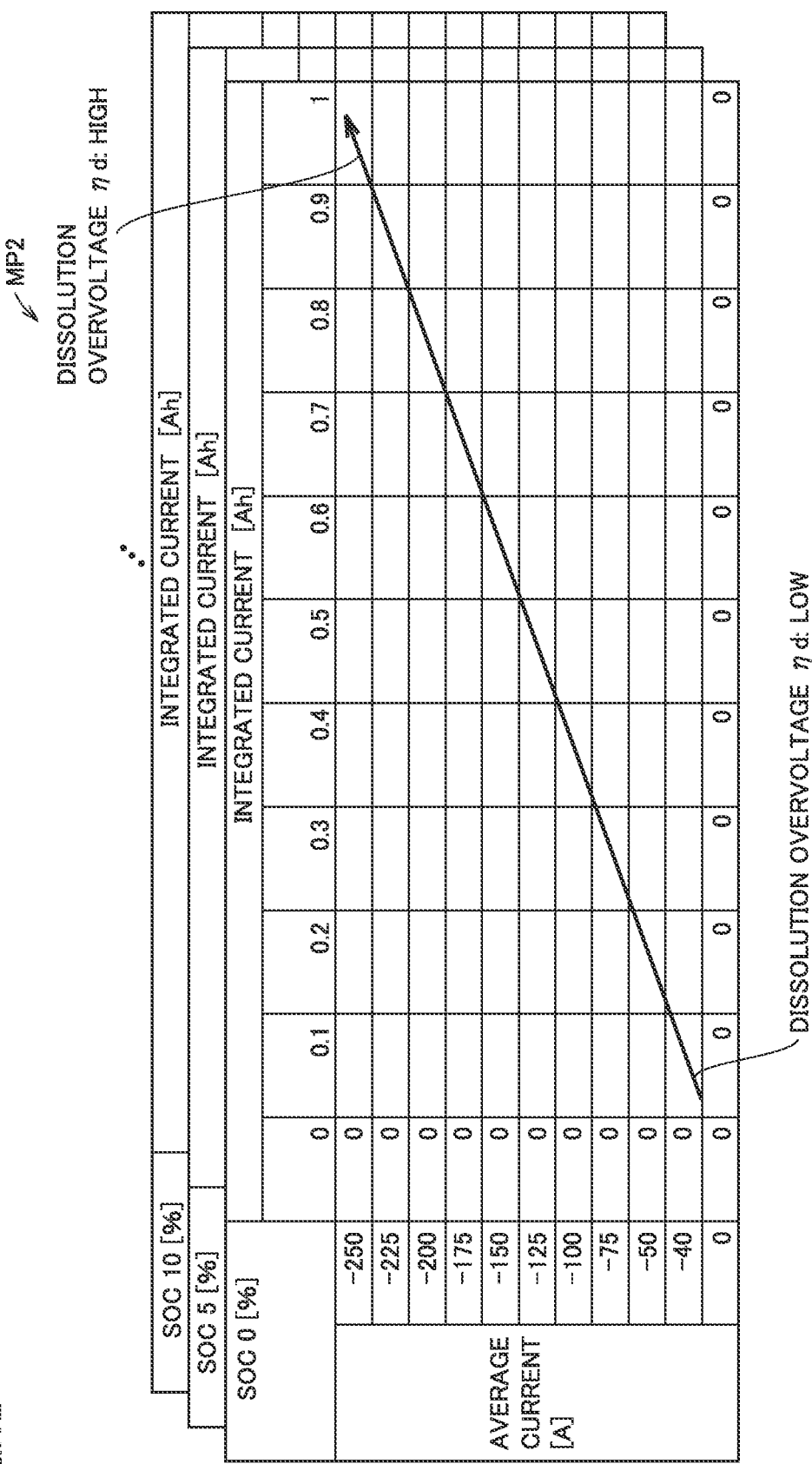
FIG. 12 is a diagram showing an example of a correction map MP2.

FIG. 12 is a diagram showing an example of correction map MP2. Also in correction map MP2 shown in FIG. 12, as in correction map MP1, dissolution overvoltage ηd is defined for each combination of the SOC of battery 10, average current IBave, and integrated current ΣIB (SOC, IBave, SIB). As indicated by an arrow in the drawing, dissolution overvoltage ηd also becomes higher from the lower left to the upper right in the drawing.

Returning back to FIG. 11, in S210, ECU 100 corrects negative electrode potential V2, using dissolution overvoltage ηd obtained by referring to correction map MP2. More specifically, dissolution overvoltage ηd is added to negative electrode potential V2 before correction (V2+ηd→V2).

In this manner, when lithium deposition occurs, correction of negative electrode potential V2 is performed by the process in S208, whereas when lithium dissolution occurs, correction of negative electrode potential V2 is performed by the process in S210. Then, it is determined whether or not negative electrode potential V2 after correction is less than or equal to 0 V (S211). The processes in and after S211 are equal to the corresponding processes in the first embodiment.

It should be noted that, when negative electrode potential V2 before correction is higher than 0 V (NO in S203), it is determined whether or not there is a history of lithium deposition (S204). When there is a history of lithium deposition (YES in S204), it is assumed that dissolution of deposited lithium may occur, and the processing is advanced to S209. On the other hand, when there is no history of lithium deposition (NO in S204), no lithium dissolution occurs either, and thus subsequent processes are all skipped and the processing is returned to the main routine.

As described above, according to the second embodiment, negative electrode potential V2 is corrected in consideration of lithium dissolution from lithium deposition region A in addition to lithium deposition on lithium deposition region A. By considering both lithium deposition and lithium dissolution in this manner, the accuracy of calculating negative electrode potential V2 can be further improved. Hence, the state of deposition of lithium on negative electrode 16 can be estimated more accurately.

Although the embodiments of the present disclosure have been described, it should be understood that the embodiments disclosed herein are illustrative and non-restrictive in every respect. The scope of the present disclosure is defined by the scope of the claims, and is intended to include any modifications within the scope and meaning equivalent to the scope of the claims.

What is claimed is:

1. A method for controlling a power converter configured to control charging current to reduce lithium deposition of secondary battery having a negative electrode including a negative electrode active material into and from which lithium ions are inserted and desorbed, the method comprising:

calculating, using an electronic control unit (ECU), an amount of lithium ions by repeatedly solving for a lithium number within a layer of the negative electrode active material, a lithium inflow number from an other layer to the layer, and a lithium outflow number from the layer to the other layer;

calculating, using the ECU, a surface potential of the negative electrode active material, using the amount of lithium ions, and a diffusion coefficient of lithium ions inside the negative electrode active material, according to a battery model for calculating lithium concentration distribution inside the negative electrode active material;

calculating, using the ECU, a voltage drop amount associated with charging of the secondary battery, using the charging current to the secondary battery and a reaction resistance of the secondary battery;

calculating, using the ECU, a negative electrode potential by subtracting the voltage drop amount from the surface potential;

calculating, using the ECU, a deposition overvoltage which promotes deposition of lithium on the negative electrode, from a state of charge of the secondary battery, an average current in a charging period of the secondary battery, and an integrated current in the charging period, the deposition overvoltage being a voltage applied from outside of the negative electrode active material to a surface of the negative electrode active material due to uneven lithium concentration distribution outside the negative electrode active material;

calculating, using the ECU, a corrected negative electrode potential by subtracting the deposition overvoltage from the surface potential from which the voltage drop amount has been subtracted;

controlling the power converter, using the ECU, to suppress the charging current based on the corrected negative electrode potential falling below a lithium reference potential;

repeating calculation of the surface potential, voltage drop amount, negative electrode potential, deposition overvoltage, and corrected negative electrode potential to generate an second corrected negative electrode potential; and controlling the power converter, using the ECU, to cease suppressing the charging current based on the second corrected negative electrode potential being above the lithium reference potential.

* * * * *